United States Patent
Halsey et al.

(10) Patent No.: US 6,543,981 B1
(45) Date of Patent: Apr. 8, 2003

(54) APPARATUS AND METHOD FOR CREATING AN ULTRA-CLEAN MINI-ENVIRONMENT THROUGH LOCALIZED AIR FLOW AUGMENTATION

(75) Inventors: Harlan I. Halsey, Woodside, CA (US); David E. Jacob, Fremont, CA (US)

(73) Assignee: Lam Research Corp., Fremont, CA (US)

(*) Notice: Subject to any disclaimer, the term of this patent is extended or adjusted under 35 U.S.C. 154(b) by 0 days.

(21) Appl. No.: 09/823,574

(22) Filed: Mar. 30, 2001

(51) Int. Cl.$^7$ ............................................. B65G 43/00
(52) U.S. Cl. ..................... 414/217.1; 414/940; 454/187
(58) Field of Search .................... 454/187; 414/217, 414/217.1, 935, 940

(56) References Cited

U.S. PATENT DOCUMENTS

| | | | | |
|---|---|---|---|---|
| 5,326,316 A | * | 7/1994 | Hashimoto et al. | 454/187 |
| 5,431,600 A | * | 7/1995 | Murata et al. | 414/411 |
| 5,892,200 A | * | 4/1999 | Kendall et al. | 217/109 |
| 5,912,184 A | * | 6/1999 | Young | 156/345 |
| 6,224,679 B1 | * | 5/2001 | Sasaki et al. | 118/719 |
| 6,347,990 B1 | * | 2/2002 | Sung et al. | 414/217 |

FOREIGN PATENT DOCUMENTS

| | | | | |
|---|---|---|---|---|
| JP | 62-87749 | * | 4/1987 | 454/187 |
| JP | 62-225839 | * | 10/1987 | 454/187 |

* cited by examiner

*Primary Examiner*—Harold Joyce
(74) *Attorney, Agent, or Firm*—Martine & Penilla, LLP

(57) ABSTRACT

A method for creating a reduced particle environment in a localized area of a mechanically active transport interface is provided. The augmentation of the air flow results in a sweeping air flow to remove particles in and around the desired area. The augmented air, flow will eliminate static or turbulent air flow regions and assist in removing potential particles from the vicinity of the substrate. This will prevent particles from being deposited on substrates thus fostering higher yields and improved quality.

18 Claims, 5 Drawing Sheets

APPARATUS AND METHOD FOR CREATING AN ULTRA-CLEAN MINI-ENVIRONMENT THROUGH LOCALIZED AIR FLOW AUGMENTATION

BACKGROUND OF THE INVENTION

1. Field of the Invention

The present invention relates generally to semiconductor substrate processing equipment, and more particularly to providing a localized ultra-clean mini-environment for substrate processing.

2. Description of the Related Art

In the manufacture of semiconductor devices, processing equipment is highly automated in order to speed transfer between processing steps. To effect the automation, there exists a large amount of moving mechanical equipment such as robots and automated doors. Any moving mechanical equipment may be a particle generator. The generated particles can be deposited on a substrate in the proximate area of the moving equipment. In addition, the particles may become entrained in air patterns within the processing module, thereby becoming capable of being deposited on any wafers or substrates within the processing module. The generated particles can cause substantial damage to semiconductor circuits formed on the wafer. For example, the particles deposited on the wafer may be entrapped by a thin film deposited on the wafer in the next processing step and render the circuit useless through this latent defect.

Semiconductor processing equipment typically employs the use of slot valves for the transport of wafers between modules. The valve covers a slot, port, aperture, etc. that is provided in the wall of the interfaced chambers, thereby isolating the chambers when the door is in a closed position. When a wafer is being transferred between modules the door will open to allow for passage of the wafer. The valves have moving mechanical parts and compressible o-rings capable of generating particles. Additionally, the valves also have an added disadvantage in that they can be located in a static air flow environment of the storage facility or processing module. In such a case, particle density in static slow moving or recirculating air surrounding a particle generation source can quickly rise. Semiconductor devices on wafers exposed to such contamination levels are at risk to damage due to particle deposition.

FIG. 1A depicts a typical semiconductor process cluster architecture 100 illustrating the various chambers of the architecture. Vacuum transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering. Connected to vacuum transport module 106 is a load lock 104 that may be implemented to introduce substrates into vacuum transport module 106. The load lock 104 is coupled to an atmospheric transport module (ATM) 103 that interfaces with the clean room 102. The ATM 103 typically has a region for holding cassettes of wafers and a robot that retrieves the wafers from the cassettes and moves them into and out of the load lock 104. As is well known, the load lock 104 serves as a pressure-varying interface between vacuum transport module 106 and the ATM 103. Therefore, vacuum transport module 106 may be kept at a constant pressure (e.g., vacuum), while the ATM 103 and clean room 102 are kept at atmospheric pressure.

FIG. 1B illustrates a partial system diagram 110 including an atmospheric transport module (ATM) 111 which includes a filter/blower 112. The filter/blower 112 is configured to generate an air flow 114 in the ATM 111. In addition, the ATM 111 is shown connected to the load lock 116. Although this type of prior art ATM 111 is capable of transferring wafers 124 from the cassette 126 into and out of the load lock 116 quite efficiently, the air flow 114 has been intended to flush particles away from the area in close proximity to the slot valve 118. However, mechanical or other design constraints may preclude achieving an optimum air flow in certain important regions of ATM 111. As a result, the air flow pattern is not the downward sweeping action 114, but rather more of a circular flow 124 or even a substantially static environment. Load lock 116 is isolated from ATM 111 by slot valve 118 making a seal 120. For example, the seal 120 may be an o-ring type seal. The wafer path 122 proceeds through the area defined by the non-sweeping air flow pattern.

During the opening and closing of the slot valve 118 when the door opens and shuts against the seal 120, particle bursts are generated through the contact of the seal and the door or other mechanically contacting surfaces. It can be appreciated that there is some pressure exerted against the seal by the slot valve in order to isolate the chambers on either side of the closed slot valve. In addition, particles trapped between the seal and the door may be released as the door opens. Therefore, the generated particles become entrained in the air flow patterns in the vicinity of the slot valve and can deposit themselves onto wafers traveling through or near the slot valve opening.

Any particles that have been deposited onto the surface of the wafer may remain on the wafer through its processing stage. These particles may cause defects in semiconductor circuits fabricated thereon, resulting in extra costs and lower yields. In some cases, the particles can migrate through an open slot valve door resulting in the potential contamination of both chambers. This problem is not limited to ATM 111 environments, but can also occur at any location where moving parts are in proximity to wafers or wafer transport paths, where off-gassing occurs and where the airflow is non-optimum. It can be appreciated that the processing equipment used in semiconductor manufacturing may include numerous moving mechanical parts capable of generating particle bursts. While the particle bursts may not be completely eliminated, the particles must be removed from the substrate path prior to the substrate moving through the vicinity of the particle burst so that the particles are not deposited on the substrate.

In view of the foregoing, what is needed is localized air flow augmentation to sweep any generated particles away from the substrate path and out of the processing module to eliminate particles from being deposited on substrates.

SUMMARY OF THE INVENTION

Broadly speaking, the present invention fills these needs by enhancing an ultra-clean mini-environment with localized air flow augmentation. The mini-environment is preferably configured to generate the air flow in a proximity region around a particle generating device. It should be appreciated that the present invention can be implemented in numerous ways, including as an apparatus, a system, a device, or a method. Several inventive embodiments of the present invention are described below.

In one embodiment, a transport passage for transport of a wafer between a first chamber and a second chamber is disclosed. The transport passage includes an air flow supply for directing air flow from a top region towards a bottom region of the first chamber. A moveable door for opening and closing an aperture is also included. The aperture is defined on a wall between the first chamber and second chamber and located between the top region and the bottom region of the first chamber. The aperture further defines a passage between the first chamber and the second chamber. A cowl defining an enclosure in a proximity region of the moveable door is also included. The cowl has a top portion that is more proximate to the top region of the first chamber and a bottom portion that is more proximate to the bottom region of the first chamber. A fan is disposed in proximity to the bottom portion of the cowl so as to augment air flow from around the proximity region at the moveable door and through the enclosure defined by the cowl.

In another embodiment, an air flow enhancer for creating a reduced particle mini-environment in a vicinity of a wafer presence is disclosed. The air flow enhancer has an air flow supply for directing air flow from a first region toward a second region. A cowl defining an enclosure in a proximity region of the particle generating device and having a top portion and a bottom portion is included. The cowl being situated so that the top portion is more proximate to the particle generating device. A fan is disposed in proximity to the bottom portion of the cowl so as to augment air flow from around the proximity region and through the enclosure defined by the cowl.

In yet another embodiment, a method for creating a reduced particle environment in a vicinity of a mechanically active transport passage interface between a first region and a second region is disclosed. The method includes generating an air flow in the first region, the air flow being directed from a first zone to a second zone of the first region. Then the active transport passage interface is transitioned. Next the air flow in the vicinity of the active transport passage interface is augmented. The augmentation further includes causing a sweeping air flow that is configured to remove particles in and around the vicinity of the active transport interface.

In still another embodiment, a method for enhancing an air flow for creating a reduced particle mini-environment in a vicinity of an active particle generating device is disclosed. The method includes generating an air flow directed from a first region towards a second region. Then the air flow in the vicinity of the active particle generating device is augmented. The augmentation further includes creating a sweeping air flow to remove particles in and around the vicinity of the active particle generating device.

The advantages of the present invention are numerous. Most notably, the augmented air, flow creates a flushing action which entrains particles in the mini-environment, thereby removing the particles from the proximity region of the transport passage interface or the particle generating device. In addition, the augmented air flow eliminates static air flow regions from which the particles can be deposited on the substrates or wafers. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described for providing a localized ultra-clean mini-environment during wafer processing. As used herein, wafer and substrate are interchangeable. The mini-environment is preferably configured to include a sweeping air flow pattern in proximity to a particle generating device so as to sweep particles away from wafers or the wafer transport path. It will be obvious, however, to one skilled in the art, that the present invention may be practiced without some or all of these specific details. In other instances, well known process operations have not been described in detail in order not to obscure the present invention.

Figure 1A:
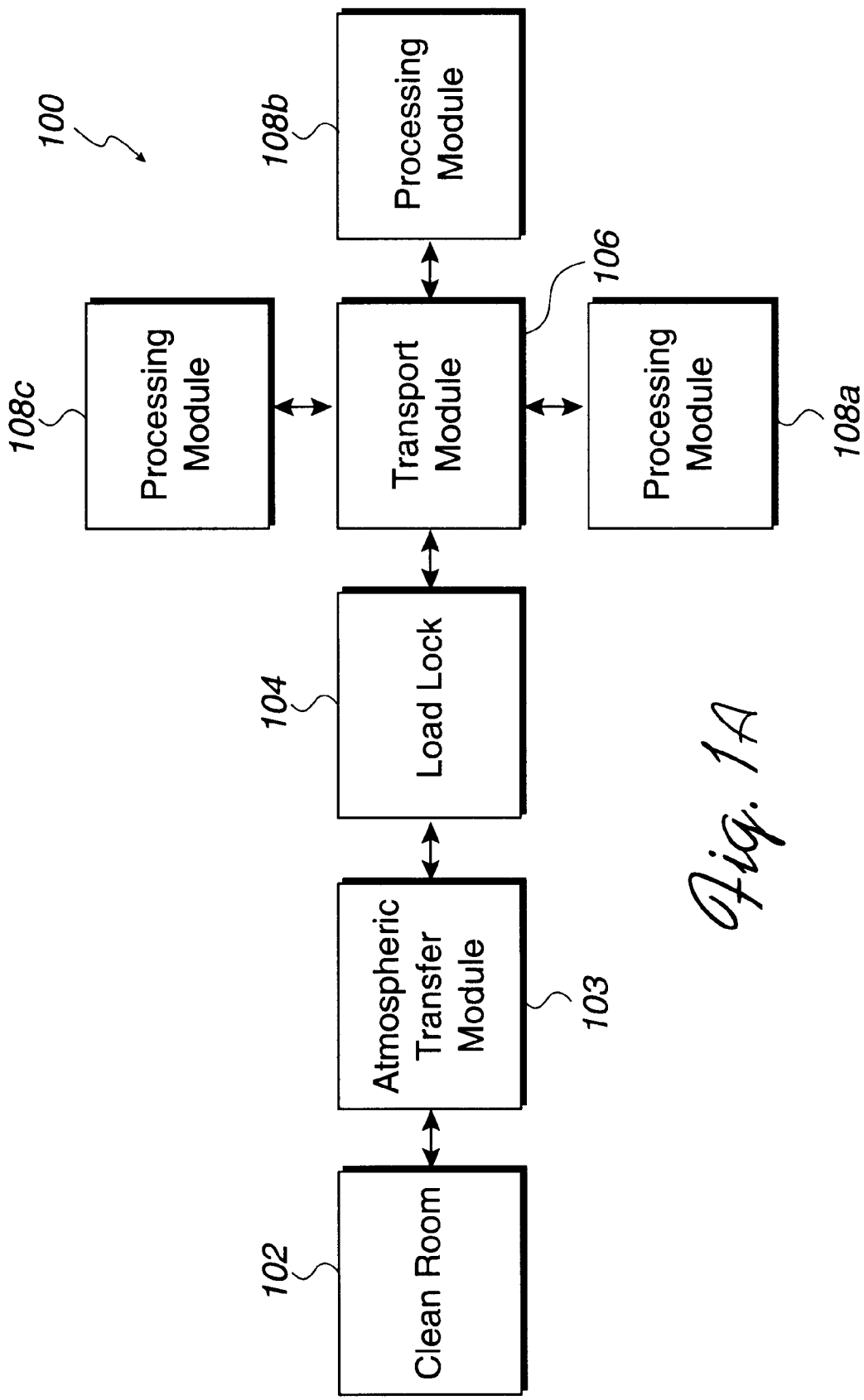
FIG. 1A depicts a typical prior art semiconductor process cluster tool architecture illustrating an atmospheric transport module.
Figure 2:
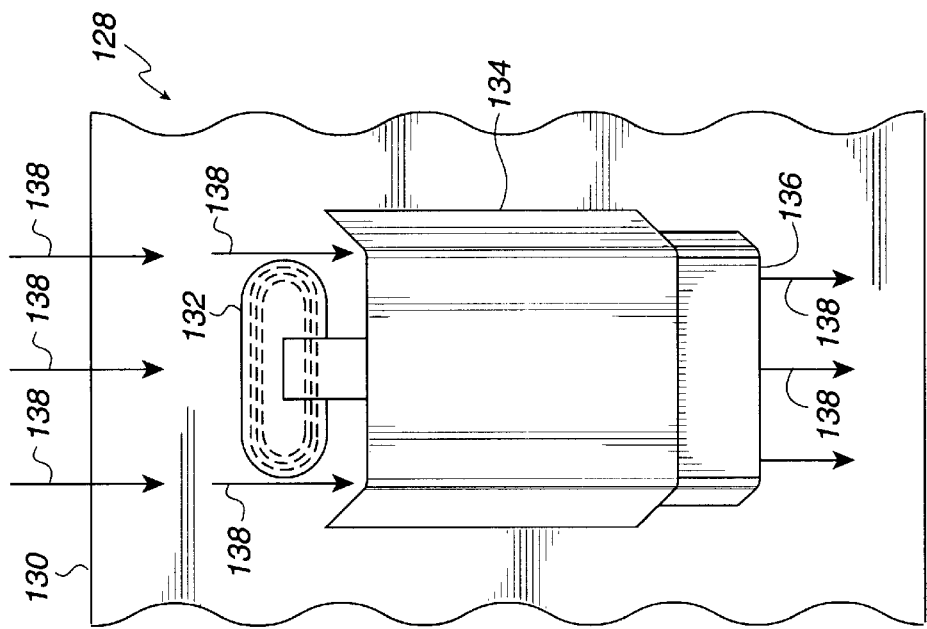
FIG. 2 illustrates a diagram of a transport passage with localized air flow augmentation in accordance with one embodiment of the invention.
Figure 1B:
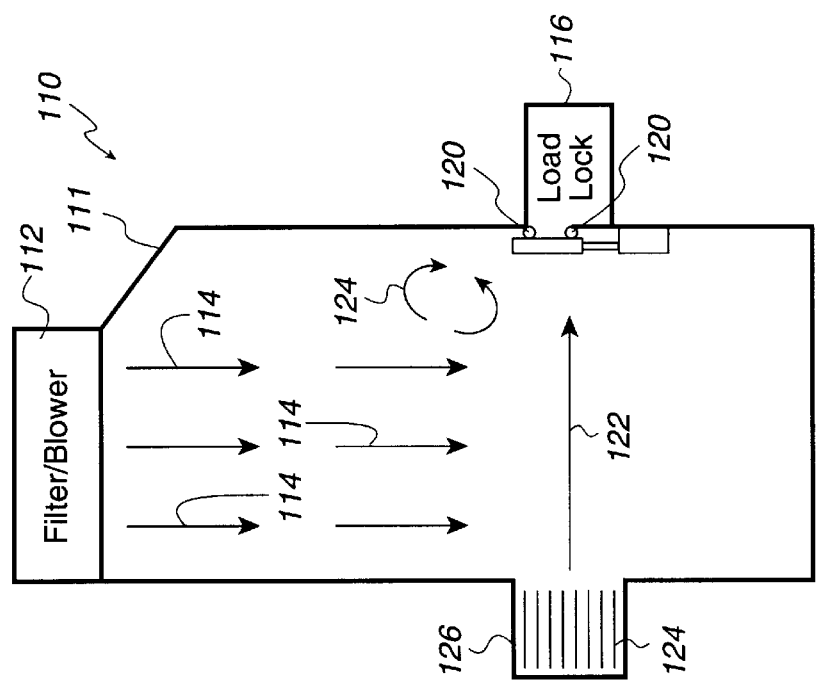
FIG. 1B illustrates a partial system diagram including an atmospheric transport module (ATM).

FIG. 2 illustrates in diagram 128 a transport passage with localized air flow augmentation in accordance with one embodiment of the invention. In diagram 128, chamber wall 130 contains an aperture covered by slot valve 132 shown in the closed position. It can be appreciated that slot valve 132 in the closed position isolates the modules on either side of the wall 130. In one embodiment of the invention, slot valve 132 may create a seal with the wall 130 through an o-ring type seal. A cowl 134 is attached to wall 130. The cowl 134 against the wall 130 defines an enclosure which directs an air flow 138. The air flow 138 is augmented by a fan 136 positioned below the cowl 134. The fan 136 generates a localized air flow 138 in the vicinity of the slot valve 132, thereby creating a sweeping action to remove any particles in the proximate region of the slot valve 132.

The cowl 134 as shown in FIG. 2 defines a trapezoidal cross section. It can be appreciated that the cross section can be numerous polygon and non-polygon shapes, such as circular, semi-circular, square, rectangular, etc. It can further be appreciated that the fan 136 may be attached to the cowl 134 or the fan 136 may be a stand-alone unit. In one embodiment of the invention, the fan 136 may have an exhaust line to remove the exhaust out of the wafer processing module through a vent. In another embodiment of the invention, the fan 136 may be positioned above the slot valve 132.

Figure 3:
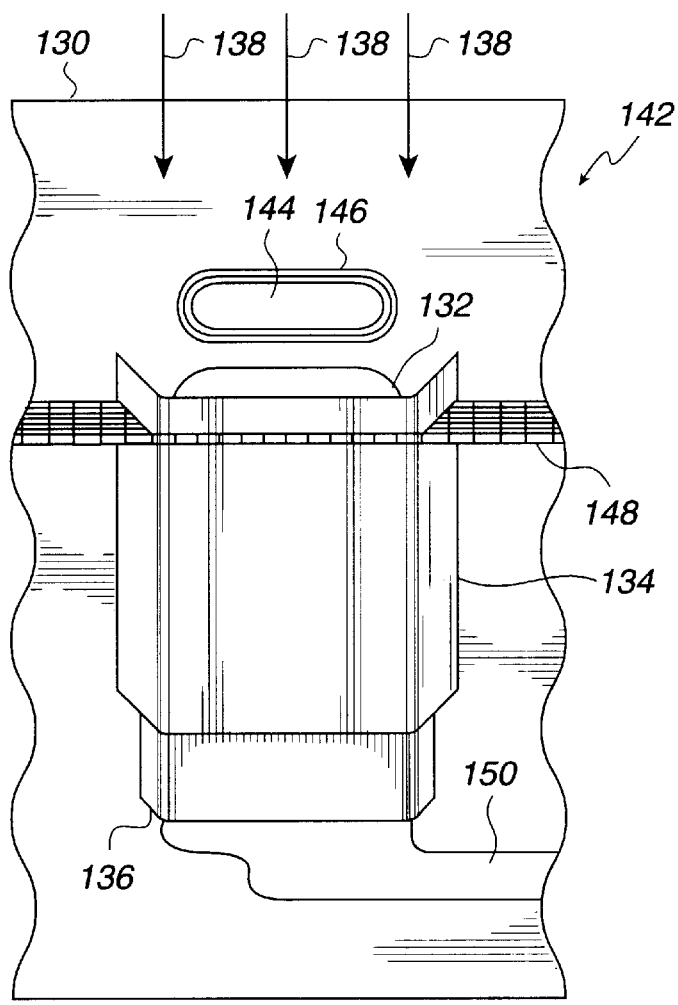
FIG. 3 illustrates another diagram of a transport passage with localized air flow augmentation in accordance with one embodiment of the invention.

FIG. 3 illustrates in diagram 142, a transport passage with localized air flow augmentation in accordance with one embodiment of the invention. In diagram 142, the chamber wall 130 contains an aperture 144 for transport of wafers to a second module located behind the wall 130. The slot valve 132 is in the open position allowing for the transport of wafers through aperture 144. O-ring 146 is attached to wall 130 and outlines the aperture 144 so that when the slot valve 132 is in a closed position, as illustrated in FIG. 2, the slot valve 132 will compressibly seal o-ring 146 to isolate the modules on each side of wall 130. O-ring 146 may be made of any elastomeric material commercially available. It can be appreciated that any suitable gasket material can be used in place of o-ring 146. It can further be appreciated that the aperture 144 and the o-ring 146 can be any shape to allow, for the passage of a substrate or wafer. A cowl 134 is attached to wall 130. The cowl 134 against the wall 130 defines an enclosure which directs an air flow 138. The air flow 138 is generated by a fan 136 positioned below the cowl 134. The exhaust duct 150 directs the particle laden airflow outside the module.

The fan 136 of FIG. 3, generates a localized air flow 138 in the vicinity of the slot valve 132, thereby creating a sweeping action to remove any particles in the proximate region of the slot valve 132. In one embodiment of the invention the o-ring seal may be attached to the slot valve 132. It can further be appreciated that repeated use, i.e. slot valve opening and closing, may wear the o-ring 146 and cause o-ring 146 to shed particles. Accordingly, particles may be introduced into the proximate vicinity of the aperture upon the opening and closing of the slot valve. In one embodiment of the invention, the air flow 138 flushes the particles generated from the opening and closing of the slot valve 132 away from the aperture 144 and through an exhaust duct 150. It can be appreciated that the exhaust duct 150 can be oriented to exhaust air flow from a side or the bottom of the module. FIG. 3 also includes a cross sectional view of a grid like perforated sheet 148.

Figure 4:
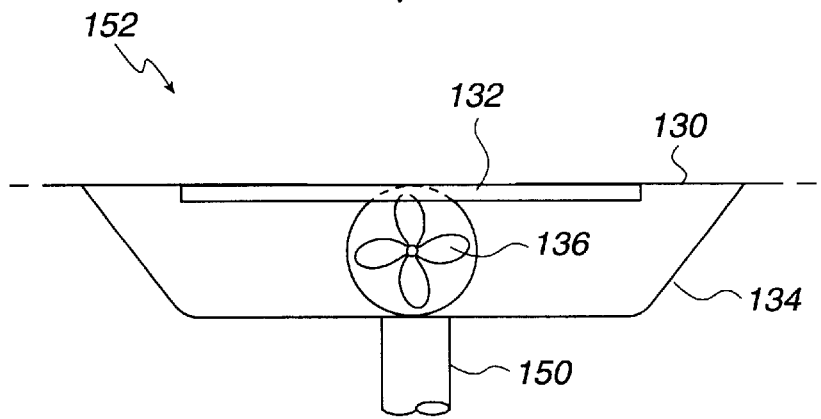
FIG. 4 illustrates a diagram of a top view of a transport passage with localized air flow augmentation in accordance with one embodiment of the invention.

FIG. 4 illustrates in diagram 152, a top view of a transport passage with localized air flow augmentation in accordance with one embodiment of the invention. Module wall 130 contains an aperture (not shown) covered by a slot valve 132 in a closed position. In one embodiment of, the invention, a seal is created by slot valve 132 contacting an o-ring (not shown) attached to wall 130. Fan 136 is configured to draw air in a sweeping motion past slot valve 132 as directed by the cowl 134. As mentioned previously, the mechanical activity of slot valve 132 may create particles and may cause the o-ring seal to shed particles through normal wear patterns. It can be appreciated that any particles generated through the mechanical activity for transitioning a wafer through the interface will be entrained in the air flow created by fan 136 and exhausted through exhaust transfer line 150. In one embodiment of the invention, fan 136 may be located above slot valve 132 to create a sweeping air flow past slot valve 132. In another embodiment of the invention, the output flow of fan 136 may be filtered.

Figure 5:
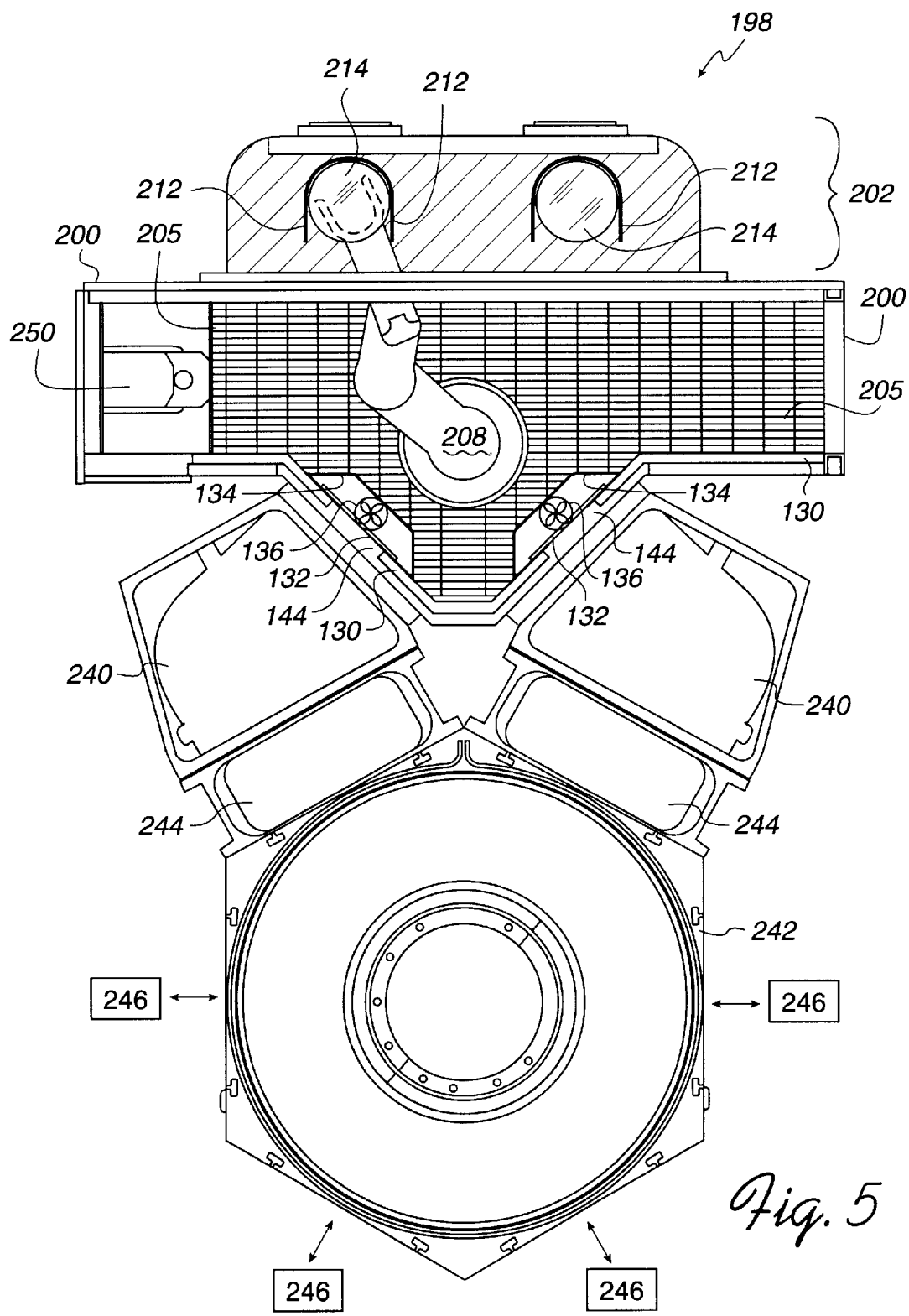
FIG. 5 shows a diagram of a top view of an exemplary transfer module that is connected to a process system, in accordance with one embodiment of the present invention.

FIG. 5 shows a diagram 198 of a top view of an exemplary transfer module 200 that is connected to a process system, in accordance with one embodiment of the present invention. The architectural geometry of the ATM 200 and the arrangement of the robot with respect to the load locks 240 are described in greater detail a co-pending U.S. Patent Application having application Ser. No. 09/342,669, entitled "Atmospheric Wafer Transfer Module with Nest For Wafer Transport Robot and Method of Implementing Same," and filed on Jun. 29, 1999 U.S. Pat. No. 6,414,811. This application is hereby incorporated by reference. As shown, the transfer module 200 is designed to communicate with a pair of load locks 240. The load locks 240 are coupled to a transport chamber 242 by way of gate valves 244. The transport chamber 242 is then capable of coupling up to processing modules 246. A robot arm (not shown) is installed in the transport chamber 242 for retrieving wafers from within the load locks 240 and inserting them into selected processing modules 246, where processing operations are performed.

The transfer module 200 of FIG. 5 is shown having an aligner 250 where wafers 214 can be aligned on the arm set 208 before they are inserted into the load locks 240. The load cell 202 is shown containing cassettes 212 having wafers 214. In this embodiment, the transfer module 200 is shown having a grid-like perforated sheet 205. A wall 130 separates the transport module 200 and the load lock 240. An aperture or passage interface 144 is defined in wall 130. Slot valve 132 in a closed position, isolates the transport module 200 from the load lock 240. In one embodiment of the invention, the slot valve compresses against an o-ring (not shown) attached to wall 130 to form a seal. It can be appreciated that the arm 208 can transport a wafer 214 from the cassette 212, to the aligner 250, through the aperture 144 and into the load lock 240. In order to allow for the passage between the interfaced transport module 200 and the load lock 240, the slot valve 132 will transition to an open position, thus exposing a transport passage through aperture 144.

A cowl 134 of FIG. 5, defines an enclosure in a proximity region of the slot valve 132. A fan 136 augments the air flow through the enclosure defined by the cowl 134 and the wall 130 so as to create a sweeping air flow in the proximity region of the slot valve 132. As mentioned above, the mechanically active slot valve 132 repeatedly compressing and uncompressing the o-ring seal is a potential source of particle generation. In one embodiment of the invention, potential particles in the slot valve region will be captured by the air flow augmented by fan 136, and eventually exhausted out of the bottom or sides of the transport module 200 through a vent. It can further be appreciated that the cross section of the enclosure defined by the cowl 134 and the wall 130 may be numerous polygon and non-polygon shapes.

As illustrated in Tables A, B and C below, the air flow augmentation has a significant impact on the particle counts in the proximity region of the slot valve 132. Table A provides the particle counts without flow augmentation. Table B and C provide results for an air flow speed at the proximity region of the slot valve of 75 feet per minute (fpm) and 350 fpm, respectively. The particle counts were measured by a Lasair model 110 available from Particle Measurement Systems Inc. of Boulder, Colo. Two runs were performed for each of the different air flow speeds represented in Tables A, B and C. The following tables are shown as exemplary test data to prove the effectiveness of the claimed embodiments. The tables are in no way meant to be limiting on the claimed invention.

TABLE A

| | Without air flow augmentation | |
|---|---|---|
| Particle size (microns) | Particle counts Run 1 | Particle counts Run 2 |
| 0.10 | 51 | 65 |
| 0.15 | 5 | 3 |
| 0.20 | 3 | 0 |
| 0.25 | 2 | 0 |
| 0.30 | 0 | 0 |
| 0.50 | 0 | 0 |
| 0.70 | 0 | 0 |
| 1.00 | 0 | 0 |

TABLE B

Air flow augmentation of 75 fpm

| Particle size (microns) | Particle counts Run 1 | Particle counts Run 2 |
| --- | --- | --- |
| 0.10 | 20 | 11 |
| 0.15 | 2 | 1 |
| 0.20 | 1 | 0 |
| 0.25 | 1 | 0 |
| 0.30 | 1 | 0 |
| 0.50 | 1 | 0 |
| 0.70 | 0 | 0 |
| 1.00 | 0 | 0 |

TABLE C

Air flow augmentation of 350 fpm

| Particle size (microns) | Particle counts Run 1 | Particle counts Run 2 |
| --- | --- | --- |
| 0.10 | 5 | 1 |
| 0.15 | 0 | 0 |
| 0.20 | 0 | 0 |
| 0.25 | 0 | 0 |
| 0.30 | 0 | 0 |
| 0.50 | 0 | 0 |
| 0.70 | 0 | 0 |
| 1.00 | 0 | 0 |

Figure 6:
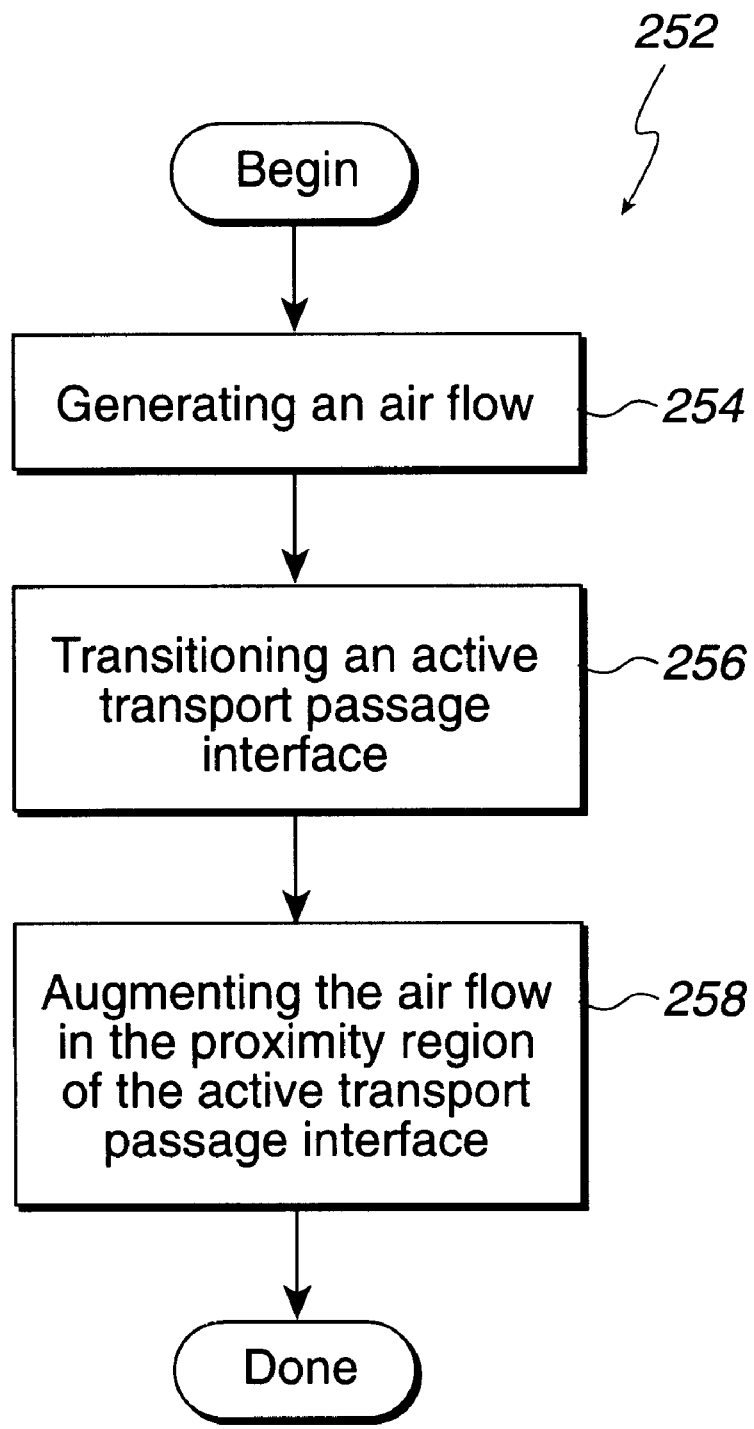
FIG. 6 illustrates a flowchart defining a method for creating a reduced particle environment in, accordance with one embodiment of the invention.

FIG. 6 illustrates a flowchart 252 defining a method for creating a reduced particle environment in accordance with one embodiment of the invention. Flowchart 252 initializes with operation 254 where an air flow is generated. Here, the air flow may be directed to flow in a vertical pattern from a top to a bottom region. In one embodiment of the invention, the air flow may be directed in a horizontal pattern or even an angular pattern from a first zone to a second zone. Next, the method proceeds to operation 256 where an active transport passage interface is transitioned. In one embodiment of the invention, the transport passage interface may be a slot valve opening and closing. In another embodiment of the invention, the active transport passage interface may be an active particle generating device. The particle generating device may contain mechanically active parts which may introduce particles into the vicinity of the device. In yet another embodiment of the invention, the air flow augmentation may be applied to a region where the air flow is static or minimal. For example, the air flow augmentation may be applied to the aligner station 250 of FIG. 5.

From operation 256, the method terminates with operation 258 where the air flow is augmented. Here, the air flow in the proximity region of the active transport passage interface is locally enhanced. It can be appreciated that the air flow augmentation causes a sweeping flow so as to remove particles in and around the vicinity of the active transport passage interface or the particle generating device. In one embodiment of the invention, a fan is used to augment the air flow and create the sweeping action. In another embodiment of the invention, the air flow is augmented in a proximity region of an active particle generating device.

It can be appreciated that the above described method can be applied anywhere localized particles are generated in semiconductor fabrication. For example, operations involving lifter stations, lifter spinners, aligner stations, pick and place by a robot, spin rinse and dry systems, load ports, wafer conditioning stations, etc., all contain active particle generating devices. As used herein a wafer conditioning station may include a wafer cooling station or an off-gassing station. It can further be appreciated that an enhanced localized air flow may be created in a proximity region of the mechanically active device, thereby purging the particles in and around the proximity region through a sweeping air flow. It can further be appreciated that the active particle generating device may produce particles through a mechanical activity, such as moving parts, or non mechanical activity, such as off-gassing.

Although the foregoing invention has been described in some detail for purposes of clarity of understanding, it will be apparent that certain changes and modifications may be practiced within the scope of the appended claims. For instance, although the cowl has been illustrated to have a particular geometry with regard to the wall the cowl can take on any number of shapes. Of particular significance, however, is the fact that the localized air flow can be applied to any particle generating device in addition to a slot valve. Accordingly, the present embodiments are to be considered as illustrative and not restrictive, and the invention is not to be limited to the details given herein, but may be modified within the scope and equivalents of the appended claims.

What is claimed is:

1. A transport passage for transport of a wafer between a first chamber and a second chamber, comprising:

an air flow supply for directing air flow from a top region towards a bottom region of the first chamber, the air flow supply generated by a first chamber fan;

a moveable door, for opening and closing an aperture defined on a wall between the first chamber and the second chamber, the moveable door located between the top region and the bottom region, the aperture defining a passage between the first chamber and the second chamber;

a cowl partially enclosing the moveable door, the cowl located in a proximity region of the moveable door, the cowl having a top portion that is more proximate to the top region of the first chamber and a bottom portion that is more proximate to the bottom region of the first chamber; and a fan disposed in proximity to the bottom portion of the cowl so as to locally augment the air flow from the first chamber fan around the proximity region and through the partial enclosure defined by the cowl.

2. A transport passage as recited in claim 1, wherein the fan is connected to the cowl and the cowl is designed to extend parallel to the wall.

3. A transport passage as recited in claim 1, wherein the fan is configured to create a localized air flow at the proximity region of the moveable door.

4. A transport passage as recited in claim 3, wherein the localized air flow at the moveable door is between about 1 foot per minute and about 500 feet per minute.

5. A transport passage as recited in claim 3, wherein the localized air flow at the moveable door is between about 40 feet per minute and about 150 feet per minute.

6. A transport passage as recited in claim 1, wherein the cowl is between about 2 inches and about 6 inches from the wall.

7. A transport module as recited in claim 3, wherein the localized air flow assists in partially removing particles near and around the proximity region that is in a vicinity of the transport passage.

8. An air flow enhancer for creating a reduced particle mini-environment in a vicinity of a wafer presence, comprising:

an air flow supply for directing air flow from a first region toward a second region, the air flow supply provided by an air flow generator;

a particle generating device, the particle generating device having moving mechanical parts causing a particle generation associated with a slot valve configured to open and close an aperture defined on a wall;

a cowl defining an enclosure in a proximity region of the particle generating device, the cowl having a top portion and a bottom portion, the cowl being situated so that the top portion is more proximate to the particle generating device, the enclosure defined by the cowl being situated on a same side of the wall as the particle generating device; and a fan disposed in proximity to the bottom portion of the cowl so as to augment the air flow supply from around the proximity region and through the enclosure defined by the cowl.

9. An air flow enhancer as recited in claim 8, wherein the fan is connected to the cowl.

10. An air flow enhancer as recited in claim 8, wherein the fan is configured to create a localized air flow at the proximity region of the particle generating device.

11. An air flow enhancer as recited in claim 10, wherein the localized air flow at the particle generating device is between about 1 foot per minute and about 500 feet per minute.

12. An air flow enhancer as recited in claim 10, wherein the localized air flow at the particle generating device is between about 40 feet per minute and about 150 feet per minute.

13. An air flow enhancer as recited in claim 8, wherein the top portion of the enclosure defined by the cowl is between about 1 inch to about 6 inches from the particle generating device.

14. An air flow enhancer as recited in claim 10, wherein the localized air flow assists in partially removing particles near and around the proximity region that is in a vicinity of the particle generating device.

15. A method for creating a reduced particle environment, in a vicinity of a mechanically active transport passage interface between a first region and a second region, comprising:

generating an air flow in the first region, the air flow being directed from a first zone towards a second zone of the first region;

defining an enclosure in a proximity region to a moveable door, the moveable door and the proximity region being located in the first region;

transitioning the moveable door located in the first region; and augmenting the air flow in the vicinity of the active transport passage interface via the enclosure, the augmenting further including, causing a sweeping air flow that is configured to remove particles in and around the vicinity of the active transport passage interface through the enclosure.

16. A method for creating a reduced particle environment in a vicinity of a mechanically active transport passage interface between a first region and a second region as recited in claim 15, further comprising:

transporting a wafer from the first region to the second region.

17. A method for creating a reduced particle environment in a vicinity of a mechanically active transport passage interface between a first region and a second region as recited in claim 15, wherein the sweeping air flow is created by a fan.

18. A method for creating a reduced particle environment in a vicinity of a mechanically active transport passage interface between a first region and a second region as recited in claim 17, wherein a cowl directs the sweeping air flow.

* * * * *